(12) United States Patent
Wakagi et al.

(10) Patent No.: US 9,991,336 B2
(45) Date of Patent: Jun. 5, 2018

(54) SEMICONDUCTOR DEVICE, METHOD FOR MANUFACTURING THE SAME, AND POWER CONVERSION SYSTEM

(71) Applicant: HITACHI POWER SEMICONDUCTOR DEVICE, LTD., Hitachi-shi, Ibaraki (JP)

(72) Inventors: Masatoshi Wakagi, Tokyo (JP); Taiga Arai, Tokyo (JP); Mutsuhiro Mori, Tokyo (JP); Tomoyasu Furukawa, Tokyo (JP)

(73) Assignee: Hitachi Power Semiconductor Device Ltd., Ibaraki (JP)

( * ) Notice: Subject to any disclaimer, the term of this patent is extended or adjusted under 35 U.S.C. 154(b) by 0 days. days.

(21) Appl. No.: 15/695,670

(22) Filed: Sep. 5, 2017

(65) Prior Publication Data

US 2018/0090564 A1 Mar. 29, 2018

(30) Foreign Application Priority Data

Sep. 27, 2016 (JP) .................. 2016-187705

(51) Int. Cl.
*H01L 29/36* (2006.01)
*H01L 29/06* (2006.01)
*H01L 27/06* (2006.01)
*H01L 29/66* (2006.01)
(Continued)

(52) U.S. Cl.
CPC ...... *H01L 29/0638* (2013.01); *H01L 21/3225* (2013.01); *H01L 27/0664* (2013.01);
(Continued)

(58) Field of Classification Search
CPC ..... H01L 29/634; H01L 29/638; H01L 29/36; H01L 29/66136; H01L 29/861;
(Continued)

(56) References Cited

U.S. PATENT DOCUMENTS 5,895,940 A * 4/1999 Kim ............... H01L 21/765
257/173
6,404,032 B1 * 6/2002 Kitada ............ H01L 29/0634
257/471

(Continued)

FOREIGN PATENT DOCUMENTS

DE 4013626 C1 5/1991
DE 4336663 A1 5/1995
(Continued)

OTHER PUBLICATIONS

Extended European Search Report dated Feb. 13, 2018 for the European Application No. 17001494.8.

*Primary Examiner* — Yemane Mehari
(74) *Attorney, Agent, or Firm* — Volpe and Koenig, P.C.

(57) ABSTRACT

An anode electrode and a cathode electrode formed on a silicon semiconductor substrate, p-type layer formed next to the anode electrode, an n-type layer formed next to the cathode electrode by a V-group element being diffused, an $n^-$ layer formed between the p-type layer and the n-type layer, and an n-buffer layer formed between the $n^-$ layer and the n-type layer and containing oxygen are provided and an oxygen concentration in an area of a width of at least 30 μm from a surface on a side of the n-type layer of the cathode electrode toward the anode electrode is set to $1 \times 10^{17}$ cm$^{-3}$ or more and also the oxygen concentration of the $n^-$ layer in a position in contact with the p-type layer is set to less than $3 \times 10^{17}$ cm$^{-3}$.

12 Claims, 13 Drawing Sheets

(51) Int. Cl.
　　　*H01L 21/322* (2006.01)
　　　*H02M 7/5395* (2006.01)
　　　*H01L 29/861* (2006.01)
　　　*H02P 27/08* (2006.01)

(52) U.S. Cl.
　　　CPC ........ *H01L 29/36* (2013.01); *H01L 29/66136* (2013.01); *H01L 29/861* (2013.01); *H02M 7/5395* (2013.01); *H02P 27/08* (2013.01)

(58) Field of Classification Search
　　　CPC ............ H01L 21/3225; H01L 27/0664; H02M 7/5359; Y02E 10/50
　　　USPC ....... 257/173, 306, 431, 493, 601, 623, 634; 363/131
　　　See application file for complete search history.

(56) References Cited

U.S. PATENT DOCUMENTS

| | | | | |
|---|---|---|---|---|
| 6,583,496 B2* | 6/2003 | Galtie | .................. | H01L 21/761 257/107 |
| 7,982,276 B2* | 7/2011 | Iwai | ........................ | H01L 31/10 257/431 |
| 8,362,595 B2* | 1/2013 | Suzuki | ................ | H01L 29/8613 257/586 |
| 8,860,171 B2* | 10/2014 | Kitagawa | ............ | H01L 27/0629 257/492 |
| 2002/0195640 A1* | 12/2002 | Kameda | ............ | H01L 29/7835 257/306 |
| 2012/0248576 A1 | 10/2012 | Schmidt et al. | | |
| 2013/0249058 A1 | 9/2013 | Neidhart et al. | | |
| 2014/0070379 A1 | 3/2014 | Ishimaru et al. | | |
| 2015/0325440 A1 | 11/2015 | Schulze et al. | | |

FOREIGN PATENT DOCUMENTS

| | | |
|---|---|---|
| EP | 2706576 A2 | 3/2014 |
| JP | 2008-251679 A | 10/2008 |
| JP | 2014-146721 A | 8/2014 |
| JP | 2016-184713 A | 10/2016 |
| WO | 2007/055352 A1 | 5/2007 |
| WO | 2011/052787 A1 | 5/2011 |

\* cited by examiner

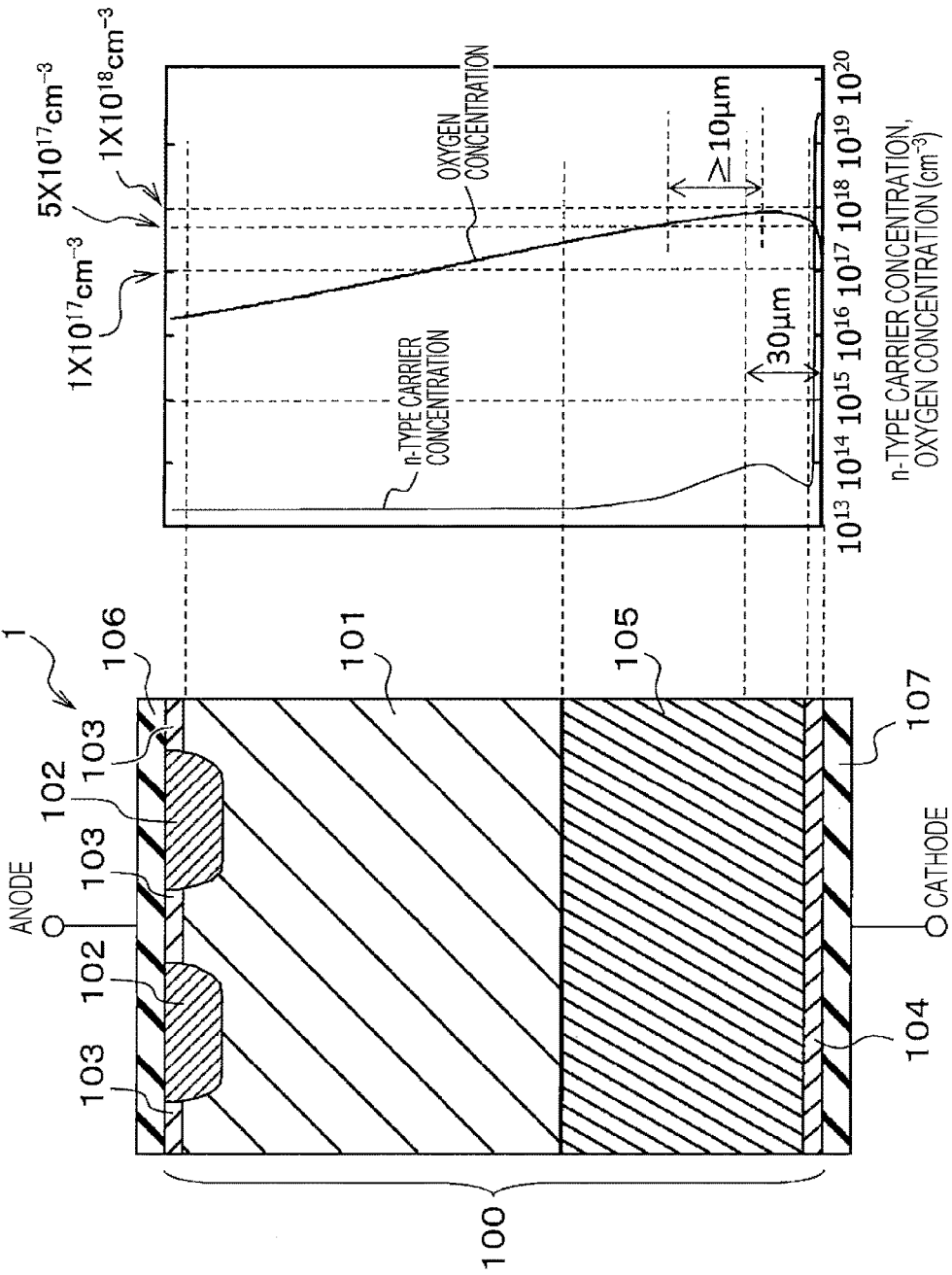

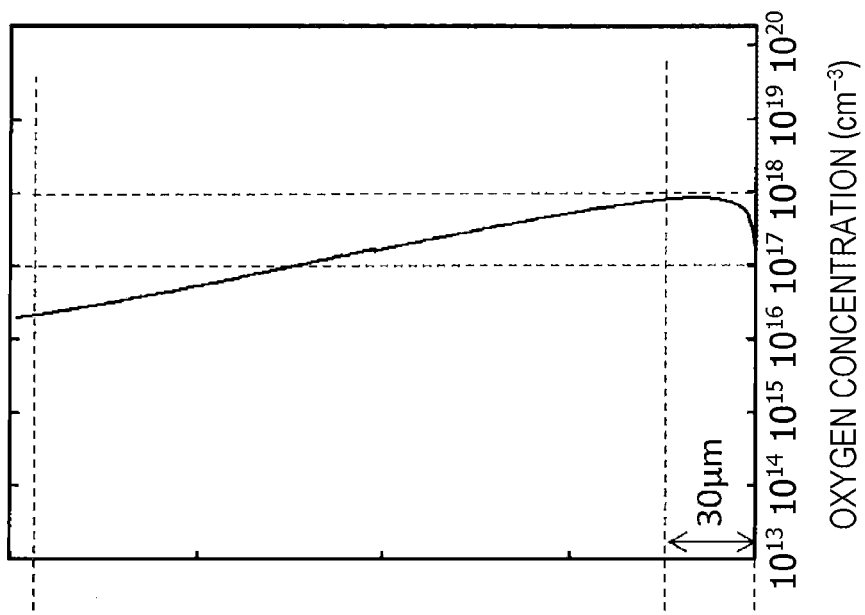
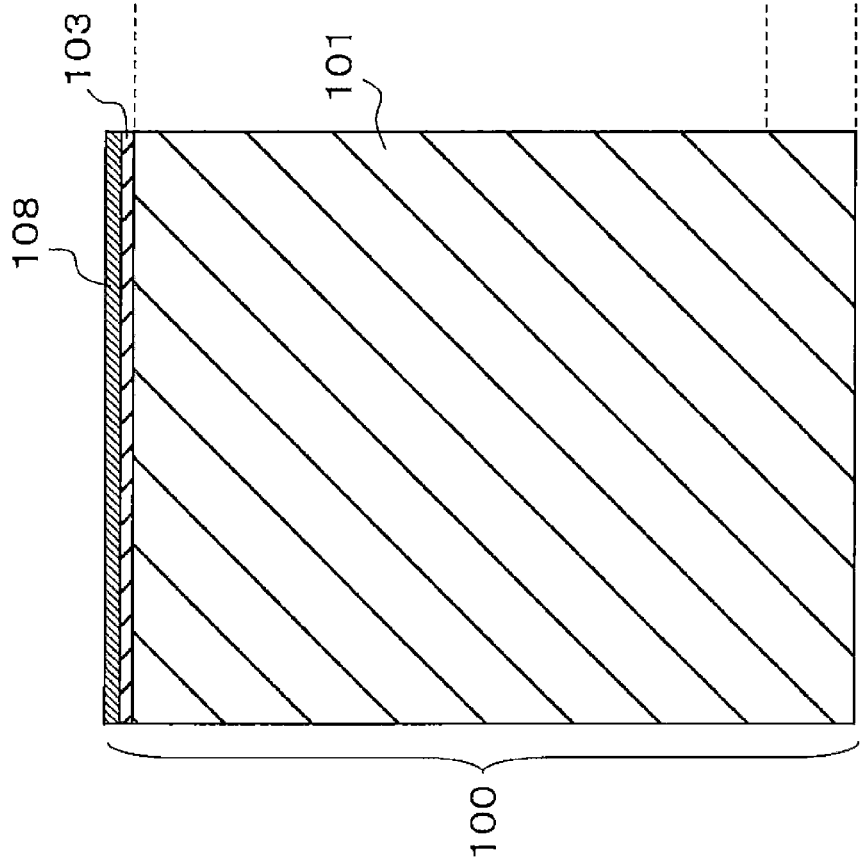

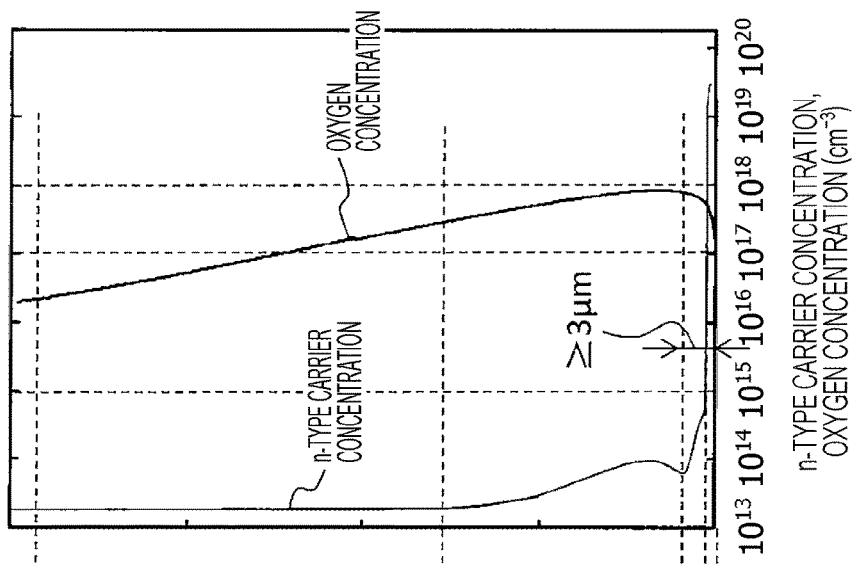
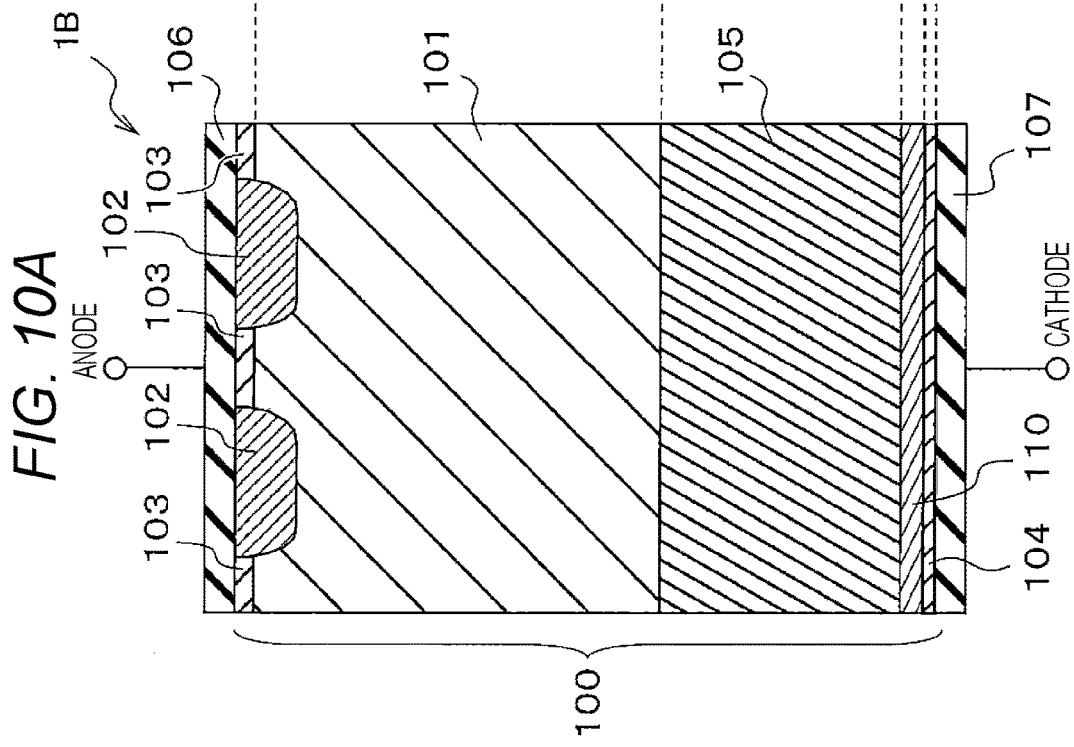

SEMICONDUCTOR DEVICE, METHOD FOR MANUFACTURING THE SAME, AND POWER CONVERSION SYSTEM

BACKGROUND OF THE INVENTION

1. Field of the Invention

The present invention relates to a semiconductor device, a method for manufacturing the same, and a power conversion system.

2. Description of the Related Art

The implementation of a deep n-buffer layer has been known as a technology to suppress an oscillation phenomenon due to a rapid decrease of a tail current (see, for example, JP-2008-251679-A).

Also, the application of phosphorus (P) as a dopant of a deep n-buffer layer has been known as a technology to form a deep n-buffer layer to suppress the oscillation phenomenon due to a rapid decrease of a tail current (see, for example, JP-2014-146721-A).

Also, the formation of several n-buffer layers generated by proton irradiation or local formation thereof in an n⁻ layer center portion has been known as a technology to form a deep n-buffer layer to suppress the oscillation phenomenon due to a rapid decrease of a tail current (see, for example, WO-2011/052787-A1 or WO-2007/055352-A1).

Also, the application of selenium (Se) as a dopant of a deep n-buffer layer has been known as a technology to form a deep n-buffer layer to suppress the oscillation phenomenon due to a rapid decrease of a tail current (see, for example, US-2012/0248576-A1).

SUMMARY OF THE INVENTION

A diode used as a freewheel diode by being connected in anti-parallel with an insulated gate bipolar transistor (IGBT) or metal-oxide-semiconductor (MOS) transistor in a power converter is further demanded to reduce recovery loss as a loss of diode during switching with an increasing drive frequency of the converter.

The recovery loss can be reduced by making a wafer thinner, but carriers injected in an On state during recovery decrease rapidly and accordingly a tail current decreases rapidly, posing a problem that oscillation of frequencies of several MHz or more as shown in FIG. 8 occurs.

To suppress the oscillation phenomenon, JP-2008-251679-A and JP-2014-146721-A disclose a configuration that implements a deep n-buffer layer. In this configuration, a decreasing speed of injected carriers during recovery is suppressed due to the deep n-buffer layer and the oscillation phenomenon can be suppressed by making a decrease of a tail current slower.

Particularly, JP-2014-146721-A discloses the application of phosphorus (P) as a dopant of the n-buffer layer. Also, WO-2011/052787-A1 and WO-2007/055352-A1 disclose technologies to suppress the oscillation phenomenon by a configuration in which several n-buffer layers generated by proton irradiation are formed or a configuration in which an n-buffer layer is locally formed in an n layer center portion. Further, US-2012/0248576-A1 discloses a configuration of a diode or the like in which a deep n-buffer layer using selenium (Se) as a dopant is applied.

However, JP-2008-251679-A does not disclose a concrete dopant. JP-2014-146721-A discloses P, which is a V-group element, as a dopant, but in order to disperse P 30 µm or more as described in JP-2008-251679-A, it is necessary to disperse P for a long time at a high temperature of about 1300° C., posing a problem of low productivity. For V-group elements such as As and Sb applied ordinarily as n-type dopants, the diffusion constant is still smaller so that it is necessary to further extend the diffusion time.

WO-2011/052787-A1 and WO-2007/055352-A1 disclose the formation of an n-buffer layer by proton irradiation. However, in order to generate a donor to form an n-buffer layer in a deep position, irradiation of a large amount of high-energy protons is needed. Therefore, it is necessary to accelerate protons by a cyclotron for irradiation, positing a problem of increased costs.

Further, WO-2011/052787-A1 and WO-2007/055352-A1 disclose a configuration in which an n-buffer layer is isolated and formed in a position relatively close to an anode. In this configuration, an electric field on the anode side becomes strong when a reverse bias is applied, inviting the degradation of withstand voltage and also posing a problem that a cosmic radiation ruggedness is deteriorated particularly in a high-voltage diode.

In US-2012/0248576-A1, Se is applied as a dopant of the n-buffer layer. Se has a diffusion constant larger than that of P and so a deep n-buffer layer can be formed by diffusion in a short time at low temperature. However, it is normally necessary to newly introduce an Se material to the production line, which may cause a problem of line contamination. It is also necessary to install equipment of ion implantation of Se.

In view of the above problems, it is preferable to provide a diode capable of suppressing the oscillation phenomenon at low cost. Alternatively, it is preferable to provide the configuration of a diode excellent in withstand voltage characteristics or cosmic radiation ruggedness. Alternatively, it is preferable to provide a device structure that is less likely to produce line contamination when diodes are manufactured.

The present invention is made in view of the above circumstances and an object thereof is to provide a semiconductor device that is cost-effective and at the same time, capable of suppressing the oscillation phenomenon, a method for manufacturing the same, and a power conversion system.

In order to solve the problem, a semiconductor device according to the present invention includes: an anode electrode formed on one side of a silicon semiconductor substrate; a cathode electrode formed on the other side of the silicon semiconductor substrate; a p-type layer formed next to the anode electrode; an n-type layer formed next to the cathode electrode by a V-group element being diffused; an n⁻ layer formed between the p-type layer and the n-type layer; and an n-buffer layer formed between the n⁻ layer and the n-type layer and containing oxygen, wherein an oxygen concentration in an area of a width of at least 30 µm from a surface on a side of the n-type layer of the cathode electrode toward the anode electrode is $1 \times 10^{17}$ cm$^{-3}$ or more and the oxygen concentration of the n⁻ layer in a position in contact with the p-type layer is less than $3 \times 10^{17}$ cm$^{-3}$.

According to a semiconductor device, a method for manufacturing the same, and a power conversion system in the present invention, the oscillation phenomenon can cost-effectively be suppressed.

BRIEF DESCRIPTION OF THE DRAWINGS

FIG. 1A is a schematic sectional view of a diode according to a first embodiment of the present invention in an active area and FIG. 1B is an n-type carrier concentration and oxygen concentration distribution chart;

FIG. 2A is a schematic sectional view of a manufacturing process of the diode according to the first embodiment in the active area and FIG. 2B is an oxygen concentration distribution chart;

FIG. 10A is a schematic sectional view of a diode according to a third embodiment of the present invention in the active area and FIG. 10B is an n-type carrier concentration and oxygen concentration distribution chart;

DESCRIPTION OF THE PREFERRED EMBODIMENTS

[Overview of Each Embodiment]

Figure 3:
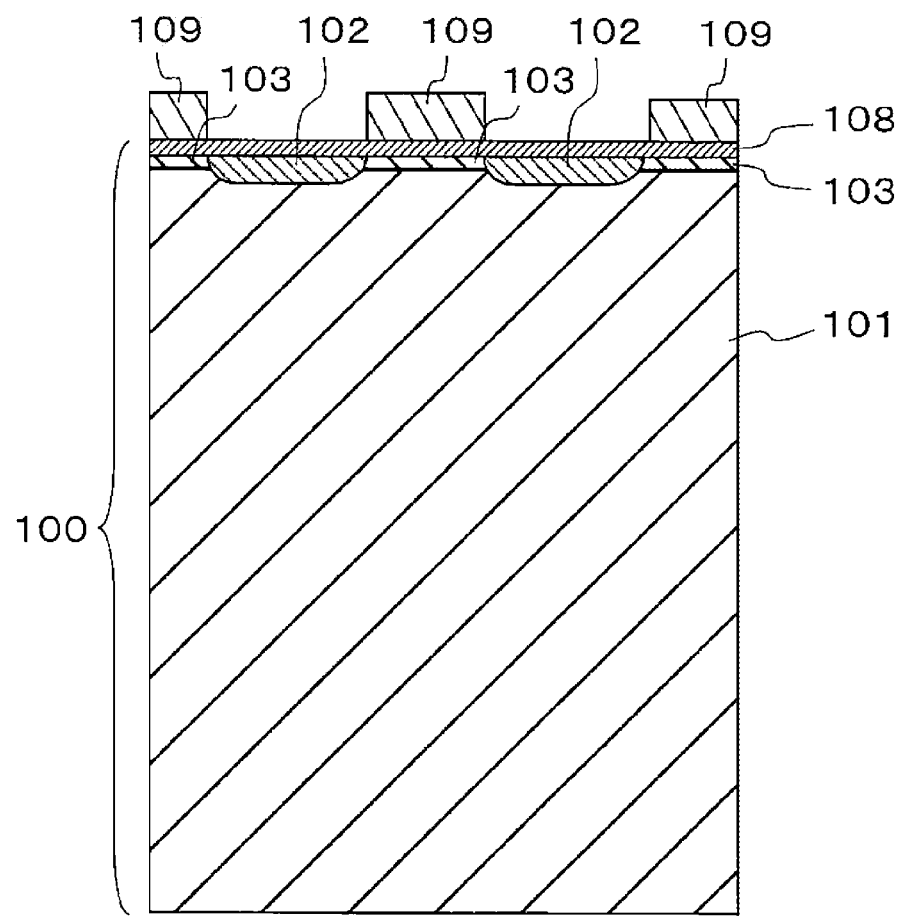
FIG. 3 is a schematic sectional view of another manufacturing process of the diode according to the first embodiment in the active area.

The diode according to each embodiment described below includes an anode electrode on one side of a silicon (Si) semiconductor and a cathode electrode on the other side thereof and also includes a p-type layer (for example, an anode p layer 102 shown in FIG. 1A) adjacent to the anode electrode and an n-type layer (for example, the cathode n layer 104 shown in FIG. 1A) adjacent to the cathode electrode. The n-type layer is formed by containing a V-group element. As the V-group element, P (phosphorus), As (arsenic), and Sb (antimony) can be cited. These elements have a high activation rate of n-type carriers and so can form an n-type layer of high concentration.

The diode includes an n-buffer layer (for example, an n-buffer layer 105 shown in FIG. 1A) containing oxygen continuously throughout an area adjacent to the n-type layer and separated by the thickness 30 μm or more. The n-type carrier concentration of the n-buffer layer is higher than the carrier concentration of an n⁻ layer (for example, an n⁻ drift layer 101 in FIG. 1A) and $1\times10^{15}$ cm$^{-3}$ or less. Further, the oxygen concentration in the area 30 μm away from the n-type layer is set to $1\times10^{17}$ cm$^{-3}$ or more and $1\times10^{18}$ cm$^{-3}$ or less, which is higher than the oxygen concentration of an area adjacent to the n-type layer. Further, the oxygen concentration of the n⁻ layer adjacent to the p-type layer described above is set to less than $3\times10^{17}$ cm$^{-3}$.

In the configuration of each embodiment described below, an oxygen thermal donor is generated to form an n-buffer layer. The diffusion coefficient of oxygen is larger than that of P, which is a V-group element, by two digits or more. Thus, oxygen can diffuse deeply in a short time. Oxygen is also used as an atmosphere of ordinary diffusion and can form an n-buffer layer configured for each embodiment by heat treatment in an oxygen atmosphere without using a special device. The oxygen thermal donor is eliminated by heat treatment at 800° C. or more and is generated by heat treatment at 400 to 600° C. Thus, in a normal diode forming process, the n-type carrier concentration of the n-buffer can be adjusted by, after an oxygen thermal donor being eliminated by heat treatment at 800 to 1000° C., forming an oxygen thermal donor by annealing as, for example, activation annealing of an n-type layer or densify annealing of a boron phosphorus silicon glass (BPSG) film formed as an interlayer dielectric, at 400 to 500° C. as a sinter after an electrode of Al or the like being formed.

The carrier concentration of the oxygen thermal donor needs to be set larger than that of the n⁻ layer. Further, the n-type carrier concentration is desirably set to $1\times10^{15}$ cm$^{-3}$ or less to ensure the life time of carriers.

The n-type carrier concentration of the oxygen thermal donor is proportional to about 5-th power of the oxygen concentration from examinations by the present inventors and the n-type carrier concentration by the thermal donor can be made larger than that of the n⁻ layer and set to $1\times10^{15}$ cm$^{-3}$ by setting the oxygen concentration in a position 30 μm away from the n-type layer to $1\times10^{17}$ cm$^{-3}$ to $1\times10^{18}$ cm$^{-3}$.

An area of minimum n-type carrier concentration can be formed by making the oxygen concentration adjacent to the n-type layer lower than that of an area 30 μm away from the n-type layer. By storing holes in the area during recovery, a tail current component can be secured to reinforce an effect of suppressing the oscillation phenomenon.

In each embodiment, the n-buffer layer is continuously formed up to an area of 30 μm or more. Also, the oxygen concentration near the p layer on the anode side is set to less than $3\times10^{17}$ cm$^{-3}$ and the n-type carrier concentration of the area is set to the level of the n⁻ layer including low withstand voltage elements. Thus, the voltage of this portion when an inverse bias is applied can be reduced so that the withstand voltage can be ensured and also cosmic radiation ruggedness characteristics can be maintained in good condition.

In the above configuration, the oxygen concentration on the cathode side is higher than that on the anode side. As described above, oxygen diffuses from both sides of a wafer after heat treatment in an oxygen atmosphere. Thus, the oxygen concentration can be reduced more on the anode side than on the cathode side by, for example, polishing the wafer from one side and setting the side as the anode side. Also, the oxygen concentration near the cathode surface can be reduced by out diffusion on the cathode side.

Here, the configuration in which an area where the oxygen concentration is $5\times10^{17}$ cm$^{-3}$ or more and $1\times10^{18}$ cm$^{-3}$ or less and the concentration decreases toward the anode side is provided at least 10 μm becomes an effective structure to prevent the oscillation phenomenon, that is, ringing during recovery of a diode. With the oxygen concentration in the above range, an oxygen donor of $1\times10^{12}$ cm$^{-3}$ to $1\times10^{15}$ cm$^{-3}$ can be formed and further, by providing a carrier concentration gradient of the n-buffer layer 105 toward the anode side by the oxygen donor in the area of 10 μm or more, the speed of depletion during recovery can gradually be delayed so that the effect of ringing prevention by soft recovery can be increased.

The configuration of each embodiment can be formed by producing a diode using the wafer. As described above, the configuration has an effect of suppressing the oscillation phenomenon. Also, the diffusion coefficient of oxygen is larger than that of P and thus, the configuration can be formed in a short time and so productivity can be improved and costs can be reduced. Also, with heat treatment in an oxygen atmosphere using a diffusion furnace, diodes can be manufactured without concerns about production line contamination.

As another configuration, a structure in which an n layer is formed by diffusion of a V-group element such as P simultaneously with diffusion of oxygen that forms an n-buffer layer is also effective. In this case, the n-buffer layer containing oxygen is continuously formed up to an area of 30 μm or more from the n layer. By setting the thickness of the n layer in this configuration to 50 μm or more, particularly a diode whose withstand voltage is 1.7 kV or less can maintain the whole wafer thick while maintaining the n⁻ layer and the n-buffer layer thin. Accordingly, wafer damage during diode manufacturing process can be prevented and also yields can be improved. Also, by setting the oxygen concentration 30 μm away from the n layer to $1\times10^{17}$ cm$^{-3}$ to $1\times10^{18}$ cm$^{-3}$, the n-type carrier concentration by the thermal donor can be made larger than that of the n-layer and also set to $1\times10^{15}$ cm$^{-3}$ or less.

Further, the oxygen concentration near the p layer on the anode side is set to less than $3\times10^{17}$ cm$^{-3}$ and the n-type carrier concentration of the area is set to the level of the n⁻ layer. Also, this configuration is effective, like the above configuration, in suppressing the oscillation phenomenon during recovery so that the withstand voltage can be ensured and also cosmic radiation ruggedness characteristics can be maintained in good condition. Also with this configuration, the process can be reduced because the formation of the n layer and the oxygen diffusion are performed simultaneously.

Hereinafter, each embodiment will be described in detail based on the drawings. In each diagram used to describe each embodiment, the same reference signs are attached to components having corresponding functions and a repeated description thereof is omitted when appropriate. Also in the description of each embodiment below, the description of the same portions or similar ones is omitted without being repeated when appropriate except when particularly needed.

First Embodiment

<Configuration of the First Embodiment>

First, the configuration of a diode according to the first embodiment of the present invention will be described with reference to FIGS. 1A and 1B. FIG. 1A is a schematic sectional view of a diode 1 according to the first embodiment in an active area and FIG. 1B is an n-type carrier concentration and oxygen concentration distribution chart thereof. In FIG. 1A, the illustration of a termination area is omitted and a known termination structure such as a field limiting ring (FLR) type in which a p-type well and an electrode are arranged in a ring shape may be applied to the termination area.

As shown in FIG. 1A, the diode 1 according to the first embodiment includes the n⁻ drift layer 101, the anode p layer 102, an anode p⁻ layer 103, the cathode n layer 104, the n-buffer layer 105 containing oxygen, an anode electrode 106, and a cathode electrode 107.

In the description that follows, including intermediate steps of the manufacturing process, an entire semiconductor layer portion will be called an Si substrate 100. Oxygen is diffused beforehand into the Si substrate 100. A wafer of the oxygen concentration distribution as shown in FIG. 1B can be produced by, for example, diffusing oxygen at 1300° C. for 15 h in an oxygen atmosphere and then polishing the wafer several hundred μm. Alternatively, a wafer into which oxygen has been diffused from both side may be cut in half to polish the cut surface.

The n⁻ drift layer 101 shown in FIG. 1A is a semiconductor layer made mainly of n-type Si and an n-type semiconductor layer made mainly of an n-type semiconductor area of an original n-type Si substrate before being denatured by ion implantation, diffusion or the like.

The cathode n layer 104 is provided on the cathode side, which is the back side of the Si substrate 100, and is a n-type semiconductor layer made of an n-type impurity area of the concentration higher than that of the n⁻ drift layer 101 and the n-buffer layer 105. As the n-type impurity of the cathode n layer 104, for example, a V-group element that is not oxygen is contained. As the V-group elements, P, As, and Sb can be cited. These elements can be made to have the activation rate of almost 100% and so are suitable for forming an n layer of high concentration.

The n-buffer layer 105 is provided between the cathode n layer 104 and the n⁻ drift layer 101 and is an n-type semiconductor layer made mainly of an oxygen thermal donor of the concentration lower than that of the cathode n layer 104 and higher than that of the n⁻ drift layer 101. With such a configuration, the stretch of a depletion layer from a PN junction to the cathode side is suppressed and so ringing can be suppressed.

The anode p layer 102 is locally provided on the anode side as a front side (upper side in FIG. 1A) of the Si substrate 100 and is a p-type semiconductor layer made mainly of a p-type impurity area. The anode p⁻ layer 103 is provided on the anode side as the front side of the Si substrate 100 in an area where the anode p layer 102 is not provided and is a p-type semiconductor layer made mainly of a p-type impurity area of the concentration lower than that of the anode p layer 102.

That is, the Si substrate 100 has a well structure on the front side in which the anode p⁻ layer 103 as a thin p-type impurity area layer of low concentration is formed and the anode p layer 102 that is thick and made mainly of a locally high-concentration p-type impurity area.

In the present embodiment, the Si substrate 100 has a well structure in which the anode p layer 102 is locally arranged in the active area (area shown in FIG. 1A) and the well structure is configured to make recovery soft by suppressing the injection amount of holes from the anode electrode 106, that is, to reduce the rebound of voltage during recovery.

The anode p layer 102 shown in FIG. 1A and arranged locally can be formed in a shape such as a dot (circular) shape or a stripe shape in a plane view when viewed from the front side of the Si substrate 100 as the anode side. For example, the anode p layer 102 can be formed in a circular shape of the diameter 10 to 100 μm and the circular shapes can be arranged by setting the distance therebetween to 10 to 200 μm. The depth of the anode p layer 102 can be set to about 3 to 10 μm and the peak concentration of p-type impurities can be set to about $1\times10^{17}$ cm$^{-3}$ to $1\times10^{19}$ cm$^{-3}$. Incidentally, the impurity concentration and dimensions of the anode p layer 102 can appropriately be set in accordance with the withstand voltage and specifications.

On the front side of the Si substrate 100, the anode p⁻ layer 103 of the concentration lower than that of the anode p layer 102 and made mainly of a p-type impurity area is formed in an area outside the area where the anode p layer 102 is provided. The peak concentration of p-type impurities of the anode p⁻ layer 103 is preferably set to about $1\times10^{15}$ cm$^{-3}$ to $1\times10^{17}$ cm$^{-3}$. If the anode p⁻ layer 103 is provided, a leak current flowing from the anode electrode 106 can be reduced when compared with a case when the anode p⁻ layer 103 is not provided. If the leak current can be tolerated, the anode p layer 102 locally provided as a p-type semiconductor layer may be applied by omitting the anode p⁻ layer 103. In that case, the process can be simplified by omitting an ion implantation process of p-type impurities to form the anode p⁻ layer 103.

The anode electrode 106 is an electrode ohmically connected to the anode p layer 102 and the cathode electrode 107 is an electrode ohmically connected to the cathode n layer 104.

<Method for Manufacturing Diodes According to the First Embodiment>

Next, an example of the method for manufacturing the structure of an active area of the diode 1 according to the present embodiment will be described. The structure of a termination area is also produced simultaneously with the structure of active area and the method for manufacturing the structure of the termination area is similar to that for manufacturing conventional diodes and so the description thereof is simplified.

(Preparations of the Substrate)

First, an Si wafer into which oxygen has been diffused is prepared as the Si substrate 100 to produce the diode 1. FIG. 2B is an oxygen concentration distribution chart of the Si substrate 100. As the Si wafer, a floating zone (FZ) wafer having the specific resistance in accordance with the withstand voltage can be used. In the present embodiment, a bulk of FZ wafer is used as the n⁻ drift layer 101. The specific resistance of the FZ wafer is set to about 250 Ωcm for a diode having the withstand voltage of, for example, 3.3 kV.

(Active Area Forming Process)

Next, an oxide film (not shown) is formed on the entire front side of the Si substrate 100 by thermal oxidation. Next, a photolithography process to form an active area as an area where the anode p⁻ layer 103 (see FIG. 1A) is to be provided is performed. In the photolithography process, a resist in which the entire surface of the active area is open is formed by applying, exposing, and developing a resist material on the front side of the Si substrate 100. At this point, the resist is also opened as an area where a p-type well is to be formed in the termination area. Subsequently, an oxide film exposed through the opening of the resist is removed by wet etching and also the resist is removed. In this process, an oxide film in which the entire surface of the active area and an area where a p-type well of the termination area is to be formed are opened is formed on the front side of the Si substrate 100.

(Anode p⁻ Layer Forming Process)

Then, as shown in FIG. 2A, an implantation-through oxide film 108 is formed on the front side of the Si substrate 100 by thermal oxidation. An area where the oxide film (not shown) formed in the active area forming process and a thick film portion of the oxide film made of the implantation-through oxide film 108 overlap becomes a mask. Then, p-type impurities to form the anode p⁻ layer 103 are implanted through the implantation-through oxide film 108 as a thin film portion. Accordingly, p-type impurities are implanted in the entire active area to entirely form the anode p⁻ layer 103.

(Anode p⁻ Layer Forming Process)

Next, as shown in FIG. 3, a photolithography process to form the anode p layer 102 is performed. In the photolithography process, a resist 109 having an opening in an area where the anode p layer 102 is to be formed of the active area is formed by applying, exposing, and developing a resist material on the front side of the Si substrate 100. At this point, an area where a p-type well is to be formed is also opened in the termination area (not shown). Then, the resist 109 is used as a mask to implant p-type impurities to form the anode p layer 102. At this point, p-type impurities are also implanted in the area where a p-type well is to be formed in the termination area (not shown) simultaneously.

Figure 4:
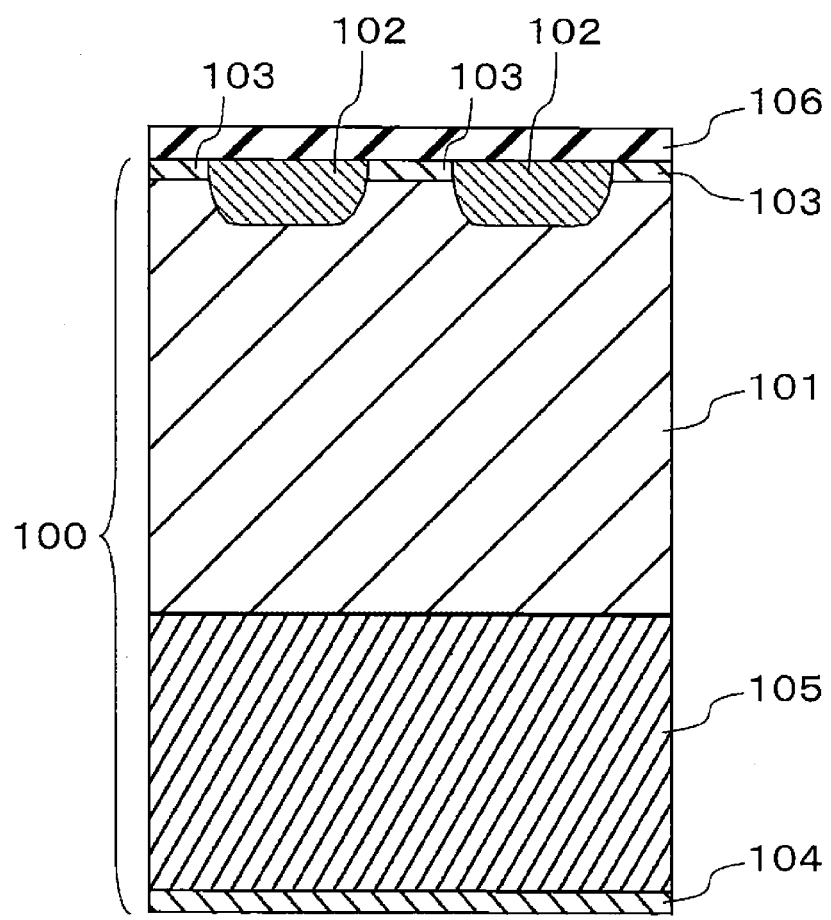
FIG. 4 is a schematic sectional view of still another manufacturing process of the diode according to the first embodiment in the active area.

Next, the resist 109 is removed and then high-temperature annealing and oxidation are performed and at this point, the Si substrate 100 looks as shown in FIG. 4 (the anode electrode 106 shown in FIG. 4 is not yet generated at this stage). Next, as shown in FIG. 4, implanted p-type impurities are diffused to form the anode p layer 102 and the anode p⁻ layer 103 and also an oxide film (not shown) formed on the front side of the Si substrate 100 is allowed to grow.

(Cathode n Layer Forming Process)

Then, n-type impurities to form the cathode n layer 104 are sequentially implanted entirely in the wafer from the back side (lower side in FIG. 4) of the Si substrate 100. As the n-type impurity, for example, a V-group element that is not oxygen is used. Next, the oxygen thermal donor can be eliminated by an impurity activation annealing process, that is, a process that activates implanted n-type impurities at 800 to 1000° C. Alternatively, prior to the impurity activation annealing process, an interlayer dielectric (not shown) such as BPSG may be formed. Also by performing densify annealing of the interlayer dielectric at 800 to 1000° C., n-type impurities can be activated and also the oxygen thermal donor can be eliminated.

(Anode Electrode/n-Buffer Layer Forming Process)

Subsequently, a photolithography process to form a contact portion is performed. In the photolithography process, a resist (not shown) having an opening in the entire active area is formed by applying, exposing, and developing a resist material.

Subsequently, an oxide film (not shown) exposed through the opening of the resist is removed by etching and also the resist is removed. Then, the film made of a conductive material to be the anode electrode 106, for example, an AlSi film is formed by sputtering or vapor deposition. The anode electrode is sintered at 400 to 500° C. By generating an oxygen thermal donor in this process, the n-type carrier concentration of the n-buffer layer 105 can be controlled with precision. Also by setting the treatment temperature after this process to 400° C. or less, a thermal donor is prevented from being additionally generated.

Then, a lithography process and an etching process to form an electrode provided on the p-type well in the termination area (not shown) are performed. Accordingly, the electrode on the p-type well is formed. At this point, as shown in FIG. 4, an AlSi film formed entirely in the active area becomes the anode electrode 106.

Next, after the resist to process the electrode provided in the termination area (not shown) being removed, a protective film is formed in the termination area. As a method for forming a protective film, for example, a solution containing a precursor material of polyimide and a photosensitive material is applied and the termination area is exposed to light to change the precursor to polyimide to be able to form a polyimide protective film in the termination area.

This completes the structure on the anode side.

(Cathode Electrode Forming Process)

Figure 5:
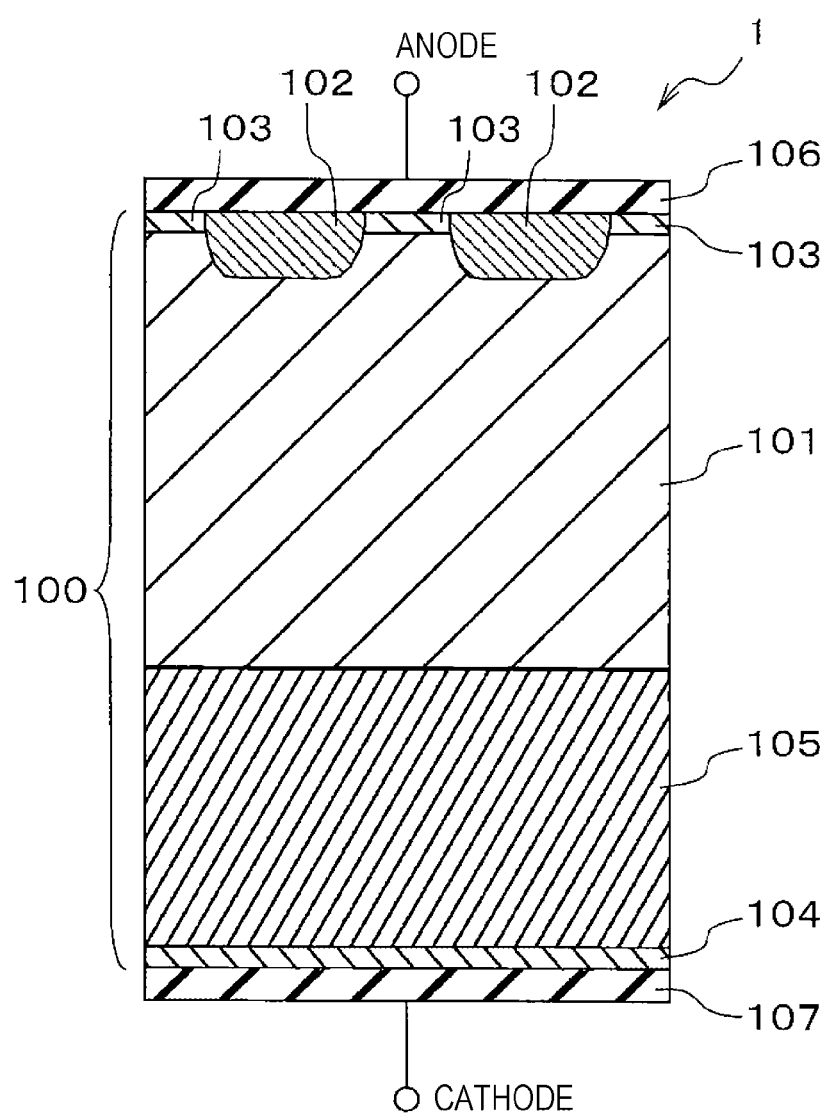
FIG. 5 is a schematic sectional view of still another manufacturing process of the diode according to the first embodiment in the active area.

Next, as shown in FIG. 5, the structure on the cathode side is formed.

First, the cathode electrode 107 is formed on the back side as the cathode side. The cathode electrode 107 can be formed by a method similar to that for forming the anode electrode 106 using an appropriate conductive material such as metal.

Then, the entire wafer area is irradiated with an electron beam from the back side (lower side in FIG. 5) to adjust the life time of carriers and further, annealing may be performed for recovery of damage done by irradiation of the electron beam.

Also, to reduce losses during recovery, the anode side may be irradiated with helium (He) proton to perform annealing at about 350° C. In this case, by making a local life time around an area where the oxygen concentration is $1 \times 10^{17}$ $cm^{-3}$ or more shorter, the amount of carriers remaining in the latter half of the recovery period can be reduced so that losses can be reduced effectively.

(Division Process)

Lastly, chips of the diode 1 are completed by dividing the wafer by dicing or the like.

Production Example

Next, a production example of producing the diode 1 according to the present embodiment will be described.

Figure 6:
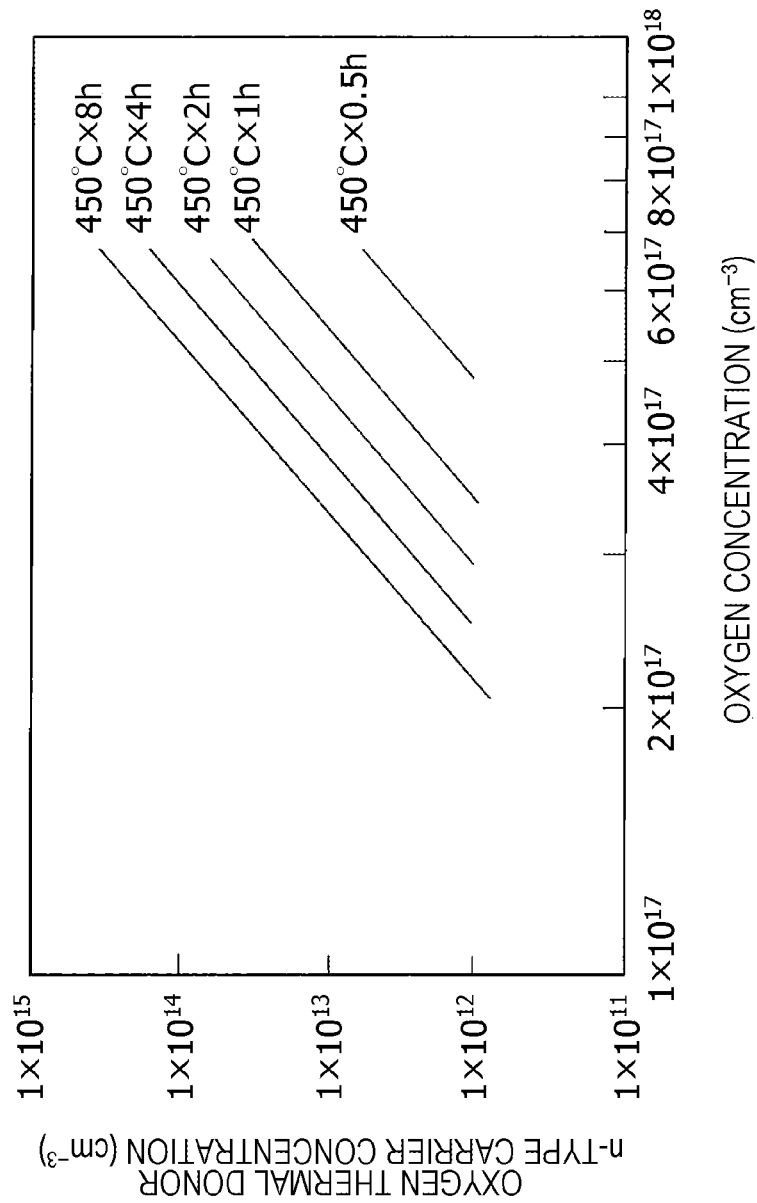
FIG. 6 is a diagram showing the relationship between an oxygen concentration and an oxygen thermal donor n-type carrier concentration.

The diode of the present production example applies a wafer into which oxygen has been diffused as the Si substrate 100. Here, an anode electrode sinter to form an oxygen thermal donor is thermally treated at 450° C. for only 0.5 to 8 h to examine the relationship between the oxygen concentration and the n-type carrier concentration. In FIG. 6, the relationship between the oxygen concentration and the oxygen thermal donor n-type carrier concentration is shown. It is evident from FIG. 6 that the gradient of log-log plotting is about 5 and the n-type carrier concentration is generated in proportion to approximately the fifth power of the oxygen concentration.

It is also evident from FIG. 6 that the n-type carrier concentration is $1 \times 10^{11}$ $cm^{-3}$ or less when the oxygen concentration is less than $1 \times 10^{17}$ $cm^{-3}$. For an ordinary 3.3-kV diode, the n-type carrier concentration of the n⁻ layer is $1.8 \times 10^{13}$ $cm^{-3}$ and thus, the n-type carrier concentration can be suppressed to 1/10 or less thereof by setting the oxygen concentration to less than $1 \times 10^{17}$ $cm^{-3}$. By setting the oxygen concentration near the anode p layer to less than $1 \times 10^{17}$ $cm^{-3}$, characteristics of the withstand voltage and the like can be ensured. In the present production example, the oxygen concentration near the anode p layer 102 in the case of a 3.3-kV diode is described and the case of a diode of low withstand voltage will be described in another embodiment described below. It is also evident that when the oxygen concentration is $1 \times 10^{18}$ $cm^{-3}$ or less, the n-type carrier concentration can be made $1 \times 10^{15}$ $cm^{-3}$ or less. In the present production example, the peak value of the n-type carrier concentration of the n-buffer layer is set to $1 \times 10^{14}$ $cm^{-3}$ by producing a diode by heat treatment for 2 h. Diode characteristics were compared with those of Comparative Example described below.

Comparative Example

Here, Comparative Example to compare with the present embodiment will be described.

Figure 7B:
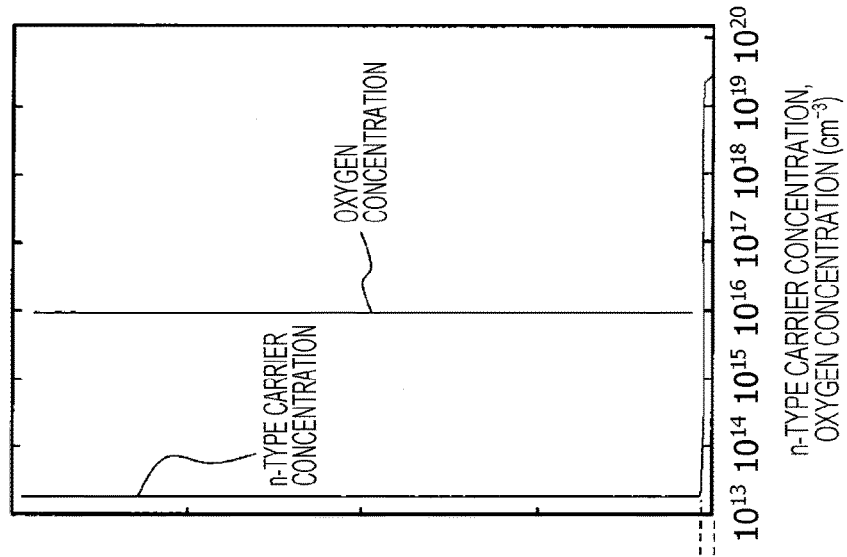
FIG. 7A is a schematic sectional view of a diode according to Comparative Example in an active area and FIG. 7B is an n-type carrier concentration and oxygen concentration distribution chart.
Figure 7A:
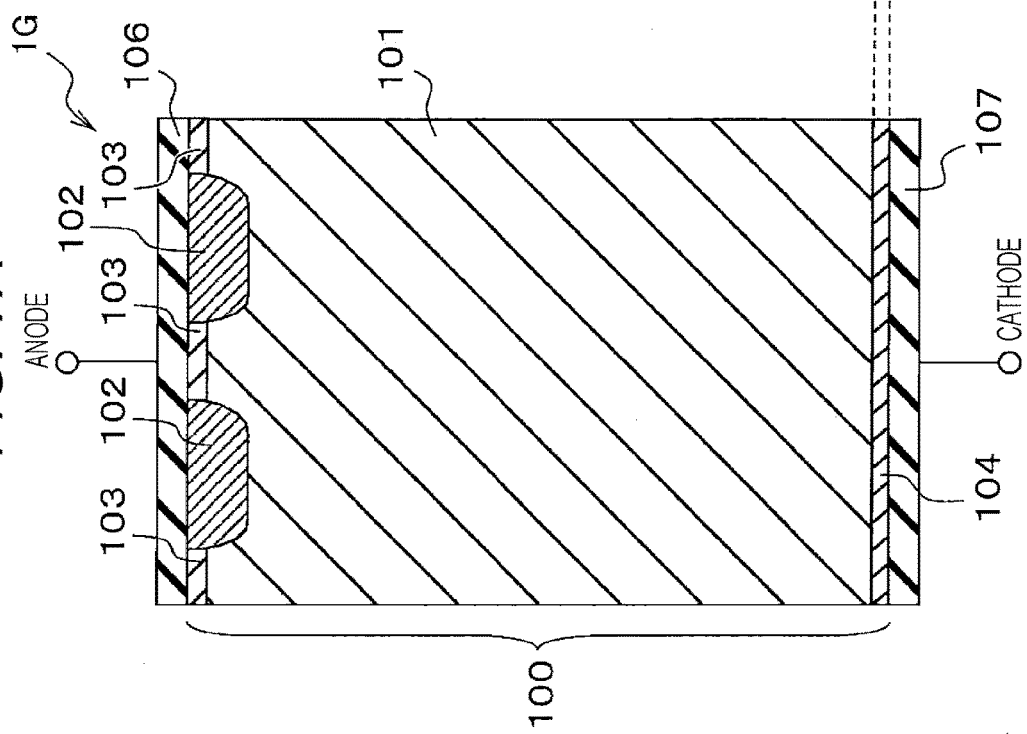

FIG. 7A is a schematic sectional view of the active area of a diode 1G according to Comparative Example and FIG. 7B is an n-type carrier concentration and oxygen concentration distribution chart thereof.

The diode 1G according to Comparative Example is formed by a production method similar to that of the first embodiment using an FZ wafer whose oxygen concentration is $1 \times 10^{16}$ $cm^{-3}$. Thus, no oxygen thermal donor is generated. The loss of the diode 1 in the above production example and that of the diode 1G in Comparative Example are equivalent.

<Effect of the First Embodiment>

Figure 8:
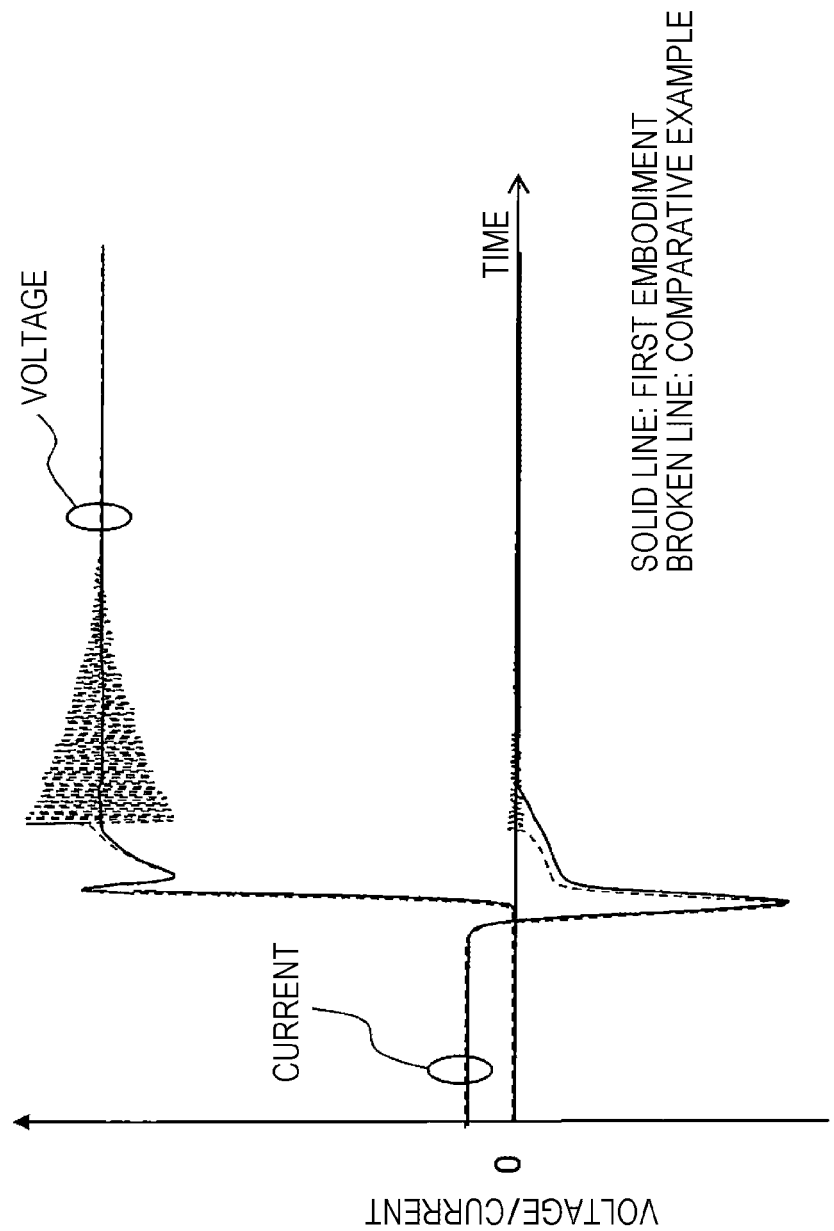
FIG. 8 is a diagram showing voltage waveforms and current waveforms of the diodes according to the first embodiment and Comparative Example during small-current recovery.

In FIG. 8, current waveforms and voltage waveforms of small current (1/10×rated current) recovery characteristics at room temperature of diodes of the production example (solid line) and Comparative Example (broken line) are shown.

It is evident from FIG. 8 that while oscillation is observed from waveforms of Comparative Example, oscillation is not observed from waveforms of the production example.

From the above result, it has been confirmed that the configuration of a diode including an n-buffer layer containing oxygen according to the present embodiment is extremely effective in reducing noise. By applying the diode to a power conversion system according to an embodiment described below or the like, reliability of the power conversion system or the like can be improved so that electromagnetic interference (EMI) can be reduced.

According to the present embodiment, as described above, the oxygen concentration in an area of the width of at least 30 μm from a surface on the side of the n-type layer (104) of the cathode electrode (107) toward the anode electrode (106) is $1 \times 10^{17}$ $cm^{-3}$ or more and the oxygen concentration of the n⁻ layer (101) in a position adjacent to the p-type layers (102, 103) is set to less than $3 \times 10^{17}$ $cm^{-3}$ and therefore, the oscillation phenomenon, that is, ringing can be suppressed cost-effectively.

Second Embodiment

Next, the configuration of a diode according to the second embodiment of the present invention will be described with reference to FIG. 9.

Figure 9:
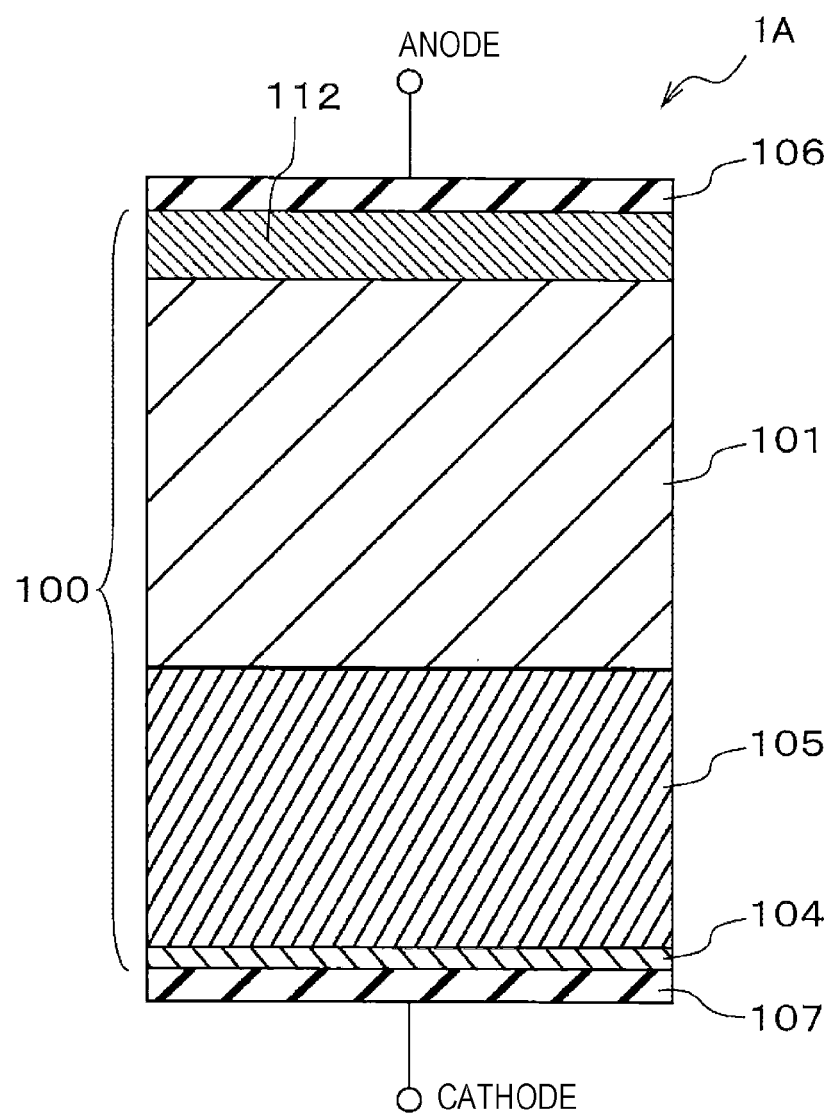
FIG. 9 is a schematic sectional view of a diode according to a second embodiment in the active area.

FIG. 9 is a schematic sectional view of a diode 1A according to the second embodiment in the active area. The illustration of a termination area is omitted, but like in the first embodiment, a termination structure such as FLR in which a p-type well and an electrode are arranged in a ring shape is used.

As shown in FIG. 9, instead of the anode p layer 102 and the anode p⁻ layer 103 of the diode 1 (see FIG. 1) in the first embodiment, an anode p layer 112 having no well structure is applied to the diode 1A according to the second embodiment. That is, the anode p layer 112 is formed entirely in the active area on the anode side. Other configurations are similar to those in the first embodiment.

Because the anode p layer 112 is formed entirely in the active area on the side of the anode electrode 106, the photolithography process to locally form the anode p layer 102 (see FIG. 1) like in the first embodiment is not needed for the diode 1A according to the present embodiment and also the process of ion implantation to form the anode p⁻ layer 103 can be omitted. Accordingly, manufacturing costs can be reduced in the present embodiment when compared with those in the first embodiment. Other processes are similar to those in the first embodiment.

Third Embodiment

Next, the configuration of a diode according to the third embodiment of the present invention will be described with reference to FIGS. 10A and 10B.

FIG. 10A is a schematic sectional view of a diode 1B according to the third embodiment in the active area. The illustration of a termination area is omitted, but like in the first embodiment, a termination structure such as FLR in which a p-type well and an electrode are arranged is used. FIG. 10B is an n-type carrier concentration and oxygen concentration distribution chart thereof.

As shown in FIG. 10A, the diode 1B according to the third embodiment has a second n-buffer layer 110 between the cathode n layer 104 and the n-buffer layer 105 of the diode 1 (see FIG. 1) according to the first embodiment. In other words, the cathode n layer can be considered to be formed in two stages by the cathode n layer 104 and the second n-buffer layer 110.

When the diode 1B according to the present embodiment is manufactured, a V-group element is implanted and diffused to the cathode side before the anode p layer 102 being formed. The diffusion may be simultaneous with the diffusion for the anode p layer 102. The second n-buffer layer 110 of 3 μm or more is formed by the diffusion. Next, processes after the anode p layer formation are performed, but these processes are similar to those in the first embodiment and so the description thereof is omitted.

According to the present embodiment, as described above, the cathode n layer can be considered to be formed in two stages and so degradation of the withstand voltage against scratches on the back side can be prevented. Thus, diodes can be produced by setting the thickness of the n layer (the n layer formed in the cathode n layer 104 and the second n-buffer layer 110 in FIG. 10A) formed initially to 3 μm or more to improve yields.

In this configuration, as shown in FIG. 10B, the n-type carrier concentration of the cathode n layer 104 is preferably set higher than the oxygen concentration. Accordingly, contact performance of the cathode electrode 107 and the cathode n layer 104 can be maintained in good condition. The maximum value of the n-type carrier concentration of the second n-buffer layer 110 is set lower than the n-type carrier concentration of the cathode n layer 104 and higher than the n-type carrier concentration of the n-buffer layer 105 containing oxygen. Accordingly, a decreasing speed of injected carriers during recovery can be suppressed and so that ringing can effectively be suppressed.

Further, as shown in FIG. 10B, the n-type carrier concentration may be set lower than the oxygen concentration in the second n-buffer layer 110. The oxygen thermal donor is about $1 \times 10^{-4}$ times the oxygen concentration and thus, by limiting the concentration of the second n-buffer layer 110 to the oxygen concentration or less, the difference of n-type carrier concentrations of the n-buffer layer 105 containing oxygen and the second n-buffer layer 110 can be reduced and therefore, the decrease of injected carriers during recovery becomes smooth and further, ringing can effectively be suppressed.

To summarize the above description, the order of concentrations in the present embodiment is as shown below:

n-type carrier concentration of the cathode n layer 104>oxygen concentration of the cathode n layer 104>maximum value of the n-type carrier concentration of the second n-buffer layer 110>n-type carrier concentration of the n-buffer layer 105 containing oxygen>n-type carrier concentration of the n⁻ drift layer 101

According to the present embodiment, as described above, the second n-buffer layer (110) into which a V-group element is diffused is provided between the n-type layer (104) and the n-buffer layer (105), the oxygen concentration of the second n-buffer layer (110) is made higher than the n-type carrier concentration of the second n-buffer layer (110), the thermal donor concentration of the second n-buffer layer (110) is made higher than that of the n⁻ layer (101), and the thermal donor concentration of the second n-buffer layer (110) is made lower than the n-type carrier concentration of a V-group element of the second n-buffer layer (110). Accordingly, the oscillation phenomenon, that is, ringing can effectively be suppressed.

Fourth Embodiment

<Configuration of the Embodiment>

Figure 11B:
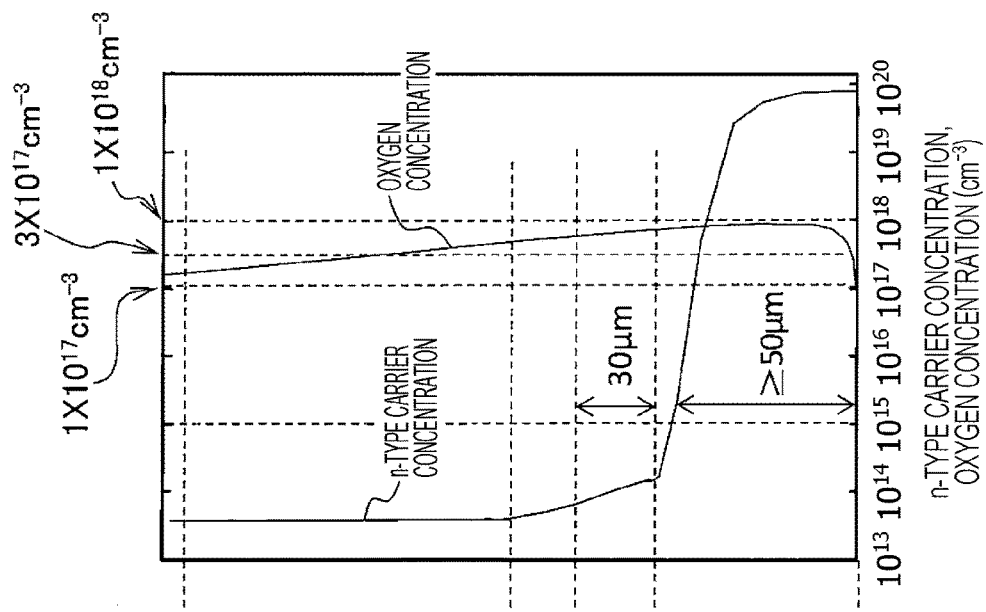
FIG. 11A is a schematic sectional view of a diode according to a fourth embodiment of the present invention in an active area and FIG. 11B is an n-type carrier concentration and oxygen concentration distribution chart.

Next, the configuration of a diode (semiconductor device) according to the fourth embodiment of the present invention will be described with reference to FIGS. 11A and 11B.

Figure 11A:
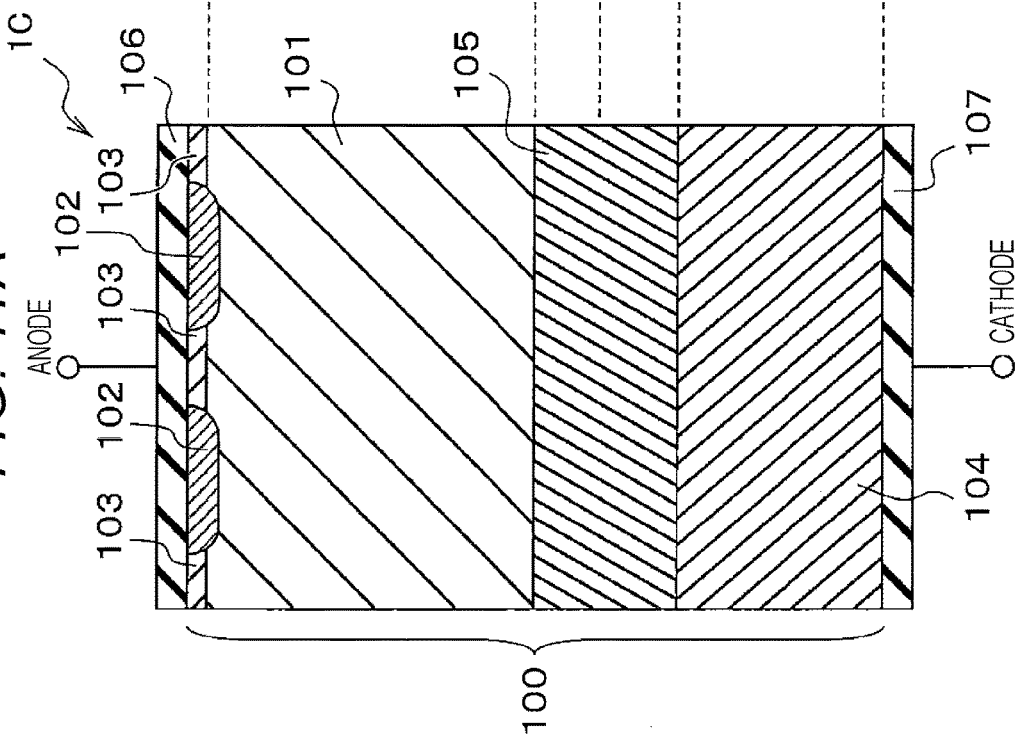

FIG. 11A is a schematic sectional view of a diode 1C (semiconductor device) according to the fourth embodiment in the active area. The illustration of a termination area is omitted, but like in the first embodiment, a termination structure such as FLR in which a p-type well and an electrode are arranged in a ring shape is used. FIG. 11B is an n-type carrier concentration and oxygen concentration distribution chart thereof.

In the present embodiment, the resistivity of the n⁻ drift layer 101 (n⁻ layer) formed in the Si substrate 100 (silicon semiconductor substrate) is set to 120 Ωcm and P diffusion of the cathode n layer 104 (n-type layer) is performed simultaneously with the diffusion of oxygen. As shown in FIGS. 11A and 11B, the diode 1C according to the fourth embodiment has the cathode n layer 104 of high concentration formed 50 μm or more. Inside the n-buffer layer 105, the oxygen concentration in an area 30 μm away from the cathode n layer 104 is $3 \times 10^{17}$ cm⁻³ or more and $1 \times 10^{18}$ cm⁻³ or less. Accordingly, the thickness of the n-buffer layer 105 containing oxygen can be made 30 μm or more.

The oxygen concentration on the anode side of the n⁻ drift layer 101 is less than $3 \times 10^{17}$ cm⁻³. The n-type carrier concentration of the n⁻ drift layer 101 in the present embodiment is $3.75 \times 10^{13}$ cm⁻³. The amount of oxygen thermal donor near the anode p layer 102 (p-type layer) can be made ¹⁄₁₀ or less that of the n⁻ drift layer 101 by setting, as described above, heat treatment conditions appropriately (see FIG. 6). Therefore, for a diode of low withstand voltage of 1.7 kV or less, the oxygen concentration near the anode p layer is suitably set to less than $3 \times 10^{17}$ cm⁻³.

When the diode 1C according to the present embodiment is formed, phosphorus glass is formed on a silicon (Si) wafer by the CVD method or the like prior to the diffusion of oxygen. Then, the wafer is thermally treated at 1300° C. for 20 h in an oxygen atmosphere. An anode surface is formed by cutting and polishing one side of the wafer. Alternatively, phosphorus glass may be formed on both sides of the Si wafer before the wafer is thermally treated in an oxygen atmosphere and cut in the center, and the cut surface is polished. Next, like in the first embodiment, the anode p⁻ layer 103 (p-type layer) and the anode p layer 102 are formed. In this configuration, the cathode n layer 104 is already formed and thus, the next cathode n layer forming process is omitted and the forming process of the anode electrode 106 and the n-buffer layer 105 is performed. At this point, densify annealing of an interlayer film such as boron phosphorus silicon glass (BPSG) may well be applied to form the n-buffer layer 105. Processes after the cathode electrode formation are similar to those in the first embodiment.

According to the present embodiment, the cathode n layer 104 can be implemented in the same process as that of the oxygen diffusion and thus, the process can be shortened.

In a diode of the withstand voltage class of 1.7 kV or less like in the present embodiment, the sum of the thickness of the n⁻ drift layer 101 and that of the n-buffer layer 105 is thin and so the configuration in which the cathode n layer is made thicker to ensure mechanical strength like in the present embodiment is effective. In a diode of the withstand voltage of 1.7 kV, the sum of the thickness of the n⁻ drift layer 101 and that of the n-buffer layer 105 is appropriately set to about 180 μm from the viewpoint of ensuring the withstand voltage and reducing the switching loss.

Figure 12:
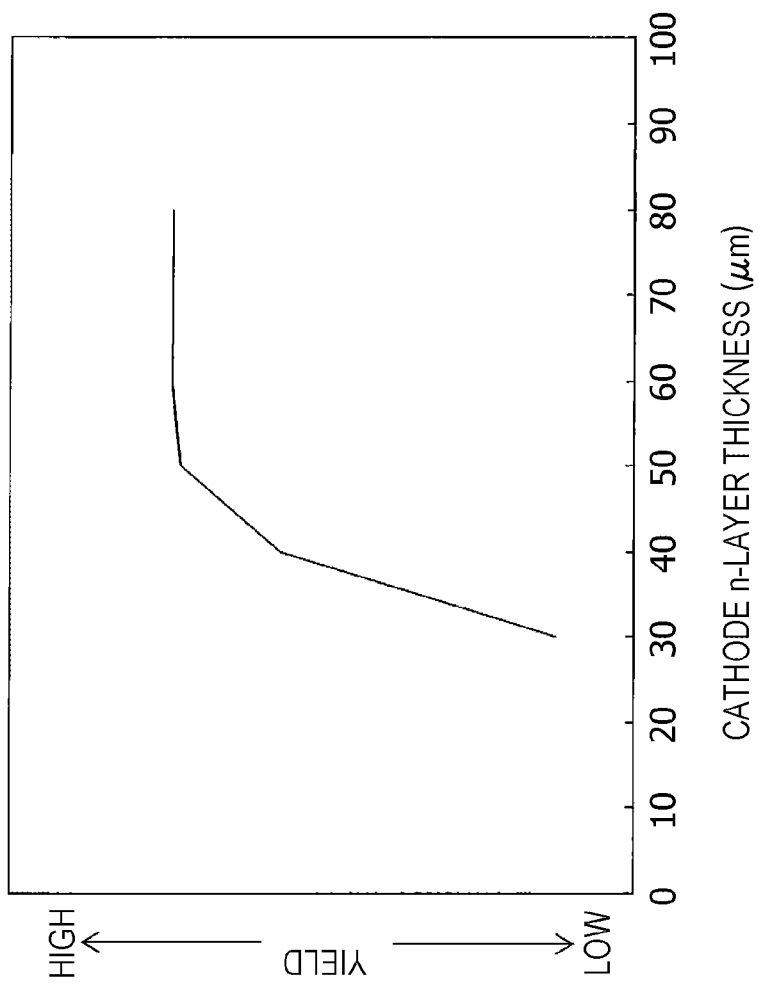
FIG. 12 is a diagram showing the relationship between yields and the thickness of a cathode n layer 104.

In FIG. 12, the relationship between the thickness of the cathode n layer 104 and upstream process yields when the cathode n layer 104 is formed in accordance with the thickness in the present embodiment is shown. It is evident from FIG. 12 that degradation of yields occurs when the thickness of the cathode n layer is less than 50 μm. Thus, it is effective to set the thickness of the cathode n layer 104 to 50 μm or more.

<Effect of the Embodiment>

As described above, the semiconductor device (1C) according to the present embodiment is characterized in that the n-type carrier concentration of the n-buffer layer (105) is higher than that of the n⁻ layer (101) and is $1 \times 10^{15}$ cm⁻³ or less, the oxygen concentration in an area of the width of at least 30 μm from the surface on the n-type layer (104) side of the cathode electrode (107) toward the anode electrode (106) is $1 \times 10^{17}$ cm⁻³ or more and $1 \times 10^{18}$ cm⁻³ or less, and the oxygen concentration of the n⁻ layer (101) in a position in contact with the p-type layers (102, 103) is less than $3 \times 10^{17}$ cm⁻³.

Accordingly, recovery characteristics (see FIG. 8) like in the first embodiment can be implemented and the oscillation phenomenon can be suppressed cost-effectively.

The n-buffer layer (105) has an oxygen concentration decreasing area (the whole 105) in which the oxygen concentration decreases toward the cathode side throughout an area of at least 10 μm and the oxygen concentration in the oxygen concentration decreasing area (the whole 105) is $5 \times 10^{17}$ cm⁻³ or more and $1 \times 10^{18}$ cm⁻³.

Accordingly, the oscillation phenomenon can further be suppressed.

The method for manufacturing the diode 1C according to the present embodiment is characterized in that a step of removing an oxygen thermal donor by heat treatment at 800° C. or higher, a step of forming the anode electrode (106), and a step of generating an oxygen thermal donor by heat treatment at 400° C. or higher are sequentially performed.

Accordingly, the n-type carrier concentration of the n-buffer can be adjusted with precision.

The method for manufacturing the diode 1C according to the present embodiment is also characterized in that a step of forming a layer containing a V-group element on the silicon semiconductor substrate (100), a step of thermally treating the silicon semiconductor substrate (100) in an atmosphere containing oxygen, a step of diffusing the V-group element and oxygen into the silicon semiconductor substrate (100) simultaneously, and a step of cutting the other surface of the silicon semiconductor substrate (100) are sequentially performed.

Accordingly, the diffusion of the V-group element and the diffusion of oxygen can be carried out in the same process so that the process can be shortened.

Fifth Embodiment

Next, a power conversion system according to the fifth embodiment of the present invention will be described with reference to FIG. 13.

Figure 13:
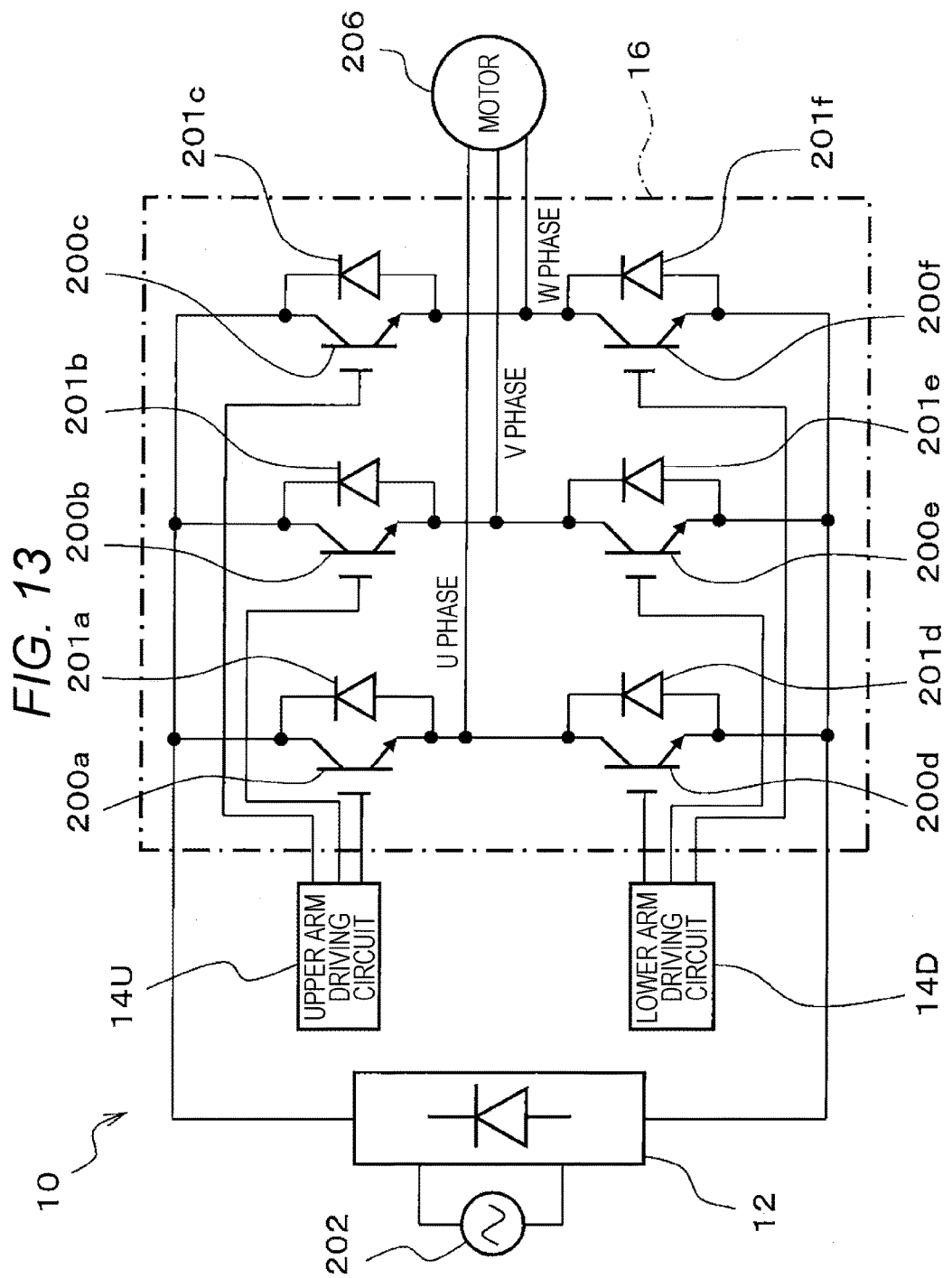
FIG. 13 is a block diagram of a power conversion system according to a fifth embodiment.

FIG. 13 is a block diagram of a power conversion system 10 according to the fifth embodiment.

As shown in FIG. 13, the power conversion system 10 according to the present embodiment includes a rectifier circuit 12, an upper arm driving circuit 14U, a lower arm driving circuit 14D, and an inverter 16.

The rectifier circuit 12 converts an AC voltage supplied from an AC power supply 202 into a DC voltage. The inverter 16 performs the pulse width modulation (PWM) of the DC voltage before applying the modulated voltage to a motor 206 of an induction machine or synchronous machine. The upper/lower arm driving circuits 14U, 14D drive an insulated gate bipolar transistor (IGBT) included in the inverter 16. The inverter 16 includes IGBT 200a to 200f as semiconductor switching elements and these IGBT 200a to 200f have diodes 201a to 201f connected in anti-parallel therewith. These diodes 201a to 201f operate as freewheel diodes.

Diodes according to any of the above embodiments or modifications thereof are applied as the diodes 201a to 201f. In the inverter 16, one of the IGBT 200a to 200c (first semiconductor switching elements) and one of the diodes 201d to 201f (second semiconductor switching elements) are combined and two such pairs are connected in series. Therefore, two anti-parallel circuits of IGBT and diodes are connected in series to constitute a half bridge circuit for one phase.

As many half bridge circuits as the number of phases of AC, three phases in the present embodiment, are included. An AC voltage of a U phase is output from a series connection point of the two IGBT 200a, 200d, that is, a series connection point of the two anti-parallel circuits. Similarly, AC voltages of a V phase and a W phase are output from series connection points of other half bridge circuits and these AC voltages are applied to the motor 206 as a 3-phase AC voltage and the motor 206 is thereby driven.

Collectors of the IGBT 200a to 200c on the upper arm side are connected in common and connected to a DC high potential side of the rectifier circuit 12. Also, emitters of the IGBT 200d to 200f on the lower arm side are connected in common and connected to a ground side of the rectifier circuit 12. The upper/lower arm driving circuits 14U, 14D control the On/Off state of the IGBT 200a to 200f by providing driving signals to gates of the IGBT 200a to 200f to cause the inverter 16 to output an AC voltage.

According to the present embodiment, diodes according to the first to fourth embodiments are connected in anti-parallel with the IGBT 200a to 200f as freewheel diodes and therefore, recovery losses during switching can be reduced. Accordingly, energy efficiency of the power conversion system 10 as a whole can be improved. In addition, diodes of the present invention suppress noise and therefore, the switching operation is stable and also EMI can be reduced.

[Modifications]

The present invention is not limited to the above embodiments and various modifications thereof can be made. The above embodiments are illustrated so that the present invention can easily be understood and do not necessarily include the whole described configuration. It is possible to replace a portion of the configuration of some embodiment with the configuration of another embodiment or add the configuration of some embodiment to the configuration of another embodiment. Also, a portion of the configuration of each embodiment may be deleted or another configuration may be added thereto or substituted therefor. Possible modifications to the above embodiments are, for example, the following:

(1) The semiconductor device of the present invention is not limited to separate diodes and the present invention may be applied to, for example, a diode contained in a semiconductor switching element of reverse conducting type. Also, in place of the IGBT 200a to 200f in the power conversion system 10 shown in FIG. 13, a semiconductor switching element such as a metal oxide semiconductor field effect transistor (MOSFET), junction type bipolar transistor, junction type FET, static induction transistor, and gate turn off thyristor (GTO thyristor).

What is claimed is:

1. A semiconductor device comprising:
an anode electrode formed on one side of a silicon semiconductor substrate;
a cathode electrode formed on the other side of the silicon semiconductor substrate;
a p-type layer formed next to the anode electrode;
an n-type layer formed next to the cathode electrode by a V-group element being diffused;
an n$^-$ layer formed between the p-type layer and the n-type layer; and
an n-buffer layer formed between the n$^-$ layer and the n-type layer and containing oxygen, wherein
an oxygen concentration in an area of a width of at least 30 μm from a surface on a side of the n-type layer of the cathode electrode toward the anode electrode is $1\times10^{17}$ cm$^{-3}$ or more and
the oxygen concentration of the n$^-$ layer in a position in contact with the p-type layer is less than $3\times10^{17}$ cm$^{-3}$.

2. The semiconductor device according to claim 1, wherein
a thickness of the n-type layer is 50 μm or more and the oxygen concentration in the area of the width of at least 30 μm from the surface on the side of the n-type layer of the cathode electrode toward the anode electrode is $3\times10^{17}$ cm$^{-3}$ or more and less than $1\times10^{18}$ cm$^{-3}$.

3. The semiconductor device according to claim 1, further comprising:
a second n-buffer layer between the n-type layer and the n-buffer layer formed by the V-group element being diffused, wherein
the oxygen concentration of the second n-buffer layer is higher than an n-type carrier concentration of the second n-buffer layer,
a thermal donor concentration of the second n-buffer layer is higher than that of the n$^-$ layer, and
the thermal donor concentration of the second n-buffer layer is lower than the n-type carrier concentration of the V-group element of the second n-buffer layer.

4. The semiconductor device according to claim 1, wherein
the n-buffer layer contains oxygen continuously throughout the area of a thickness of 30 μm.

5. The semiconductor device according to claim 4, wherein
the n-buffer layer has an oxygen concentration decreasing area in which the oxygen concentration decreases toward a cathode side throughout the area of at least 10 μm and
the oxygen concentration in the oxygen concentration decreasing area is $5\times10^{17}$ cm$^{-3}$ or more and $1\times10^{18}$ cm$^{-3}$ or less.

6. The semiconductor device according to claim 4, wherein
the oxygen concentration of the n-buffer layer in a position 30 μm away from the n-type layer is higher than that of the n-type layer.

7. The semiconductor device according to claim 4, further comprising:
a second n-buffer layer between the n-type layer and the n-buffer layer formed by the V-group element being diffused.

8. The semiconductor device according to claim 7, wherein
a maximum value of an n-type carrier concentration of the n-type layer is higher than the oxygen concentration of the n-type layer,
the maximum value of the n-type carrier concentration of the second n-buffer layer is lower than the oxygen concentration of the n-type layer,
the maximum value of the n-type carrier concentration of the n-buffer layer is lower than the maximum value of the n-type carrier concentration of the second n-buffer layer, and
the maximum value of the n-type carrier concentration of the n$^-$ layer is lower than the maximum value of the n-type carrier concentration of the n-buffer layer.

9. The semiconductor device according to claim 4, wherein
the thickness of the n-type layer is 50 μm or more.

10. A method for manufacturing a semiconductor device including:
an anode electrode formed on one side of a silicon semiconductor substrate;
a cathode electrode formed on the other side of the silicon semiconductor substrate;
a p-type layer formed next to the anode electrode;
an n-type layer formed next to the cathode electrode by a V-group element being diffused;
an n$^-$ layer formed between the p-type layer and the n-type layer; and
an n-buffer layer formed between the n$^-$ layer and the n-type layer and containing oxygen throughout an area of a thickness of 30 μm or more, wherein
an n-type carrier concentration of the n-buffer layer is higher than that of the n$^-$ layer and is $1\times10^{15}$ cm$^{-3}$,
an oxygen concentration in the area of a width of at least 30 μm from a surface on a side of the n-type layer of the cathode electrode toward the anode electrode is $1\times10^{17}$ cm$^{-3}$ or more and $1\times10^{18}$ cm$^{-3}$ or less, and
the oxygen concentration of the n$^-$ layer in a position in contact with the p-type layer is less than $3\times10^{17}$ cm$^{-3}$,
the method comprising:
removing an oxygen thermal donor by heat treatment at 800° C. or higher;
forming the anode electrode; and
generating the oxygen thermal donor by the heat treatment at 400° C. or higher.

11. The method for manufacturing a semiconductor device according to claim 10, wherein
a layer containing the V-group element is formed, the layer is thermally treated in an atmosphere containing oxygen, the V-group element and the oxygen are diffused simultaneously, and then one side thereof is removed.

12. A power conversion system including:
a first semiconductor switching element and a second semiconductor switching element connected in series; and diodes, each of which connected in anti-parallel with the first semiconductor switching element or the second semiconductor switching element, wherein
the diodes are semiconductor devices according to claim 1.

* * * * *